United States Patent
Fanori et al.

(10) Patent No.: US 9,705,536 B2
(45) Date of Patent: Jul. 11, 2017

(54) TUNABLE BALUN

(71) Applicant: Marvell World Trade LTD., St. Michael (BB)

(72) Inventors: Luca Fanori, Pavia (IT); Rinaldo Castello, Arcore (IT)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 15/198,798

(22) Filed: Jun. 30, 2016

(65) Prior Publication Data

US 2017/0012652 A1    Jan. 12, 2017

Related U.S. Application Data

(60) Provisional application No. 62/189,866, filed on Jul. 8, 2015.

(51) Int. Cl.
| | |
|---|---|
| *H04B 1/04* | (2006.01) |
| *H04B 1/16* | (2006.01) |
| *H04B 1/40* | (2015.01) |
| *H03H 7/09* | (2006.01) |
| *H03H 7/38* | (2006.01) |
| *H03H 7/42* | (2006.01) |
| *H03H 11/32* | (2006.01) |
| *H03F 3/24* | (2006.01) |
| *H04B 1/58* | (2006.01) |

(52) U.S. Cl.
CPC ............. *H04B 1/04* (2013.01); *H03F 3/245* (2013.01); *H03H 7/09* (2013.01); *H03H 7/38* (2013.01); *H03H 7/42* (2013.01); *H03H 11/32* (2013.01); *H03F 2200/06* (2013.01); *H04B 1/582* (2013.01)

(58) Field of Classification Search
CPC ........ H04B 1/04; H04B 1/0458; H04B 1/581; H04B 1/16; H03F 3/245; H03H 11/32
See application file for complete search history.

(56) References Cited

U.S. PATENT DOCUMENTS

| | | | |
|---|---|---|---|
| 5,986,617 A | 11/1999 | McLellan | |
| 2008/0075146 A1 | 3/2008 | Rofougaran et al. | |
| 2012/0075016 A1 | 3/2012 | Visser et al. | |
| 2012/0139658 A1* | 6/2012 | Mu | H03H 7/42 333/25 |
| 2015/0194944 A1* | 7/2015 | Joshi | H04B 1/0458 327/551 |

OTHER PUBLICATIONS

Written Opinion and Search Report for PCT Application No. PCT/IB2016/054097 mailed Nov. 7, 2016.

\* cited by examiner

*Primary Examiner* — Nguyen Vo

(57) ABSTRACT

A system includes a balun, a power monitoring circuit, a first circuit, and a second circuit. The balun includes a first inductor to receive an input and a second inductor to couple the input to a load. The power monitoring circuit is configured to monitor an amount of power being delivered to the load when the input is coupled to the load. The first circuit is configured to couple an entire of the second inductor to the first inductor when a first power is delivered to the load. The second circuit is configured to couple a portion of the second inductor to the first inductor when a second power that is less than the first power is delivered to the load.

13 Claims, 5 Drawing Sheets

TUNABLE BALUN

CROSS-REFERENCE TO RELATED APPLICATIONS

This application claims the benefit of U.S. Provisional Application No. 62/189,866, filed on Jul. 8, 2015. The entire disclosure of the application referenced above is incorporated herein by reference.

FIELD

The present disclosure relates generally to active circuits and more particularly to a tunable balun used to couple a differential output to a single-ended load.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A balun is used to couple an output of an active circuit to a load. For example, in a wireless transmitter, a balun is used to convert a differential output of an up-converter to a single-ended antenna. In some other examples, a balun is used to couple an output of an amplifier to a load such as a loud speaker, for example.

SUMMARY

A system comprises a balun, a power monitoring circuit, a first circuit, and a second circuit. The balun includes a first inductor to receive an input and a second inductor to couple the input to a load. The power monitoring circuit is configured to monitor an amount of power being delivered to the load when the input is coupled to the load. The first circuit is configured to couple an entire of the second inductor to the first inductor when a first power is delivered to the load. The second circuit is configured to couple a portion of the second inductor to the first inductor when a second power that is less than the first power is delivered to the load.

In other features, the power monitoring circuit is configured to generate a first signal to activate the first circuit when the first power is delivered to the load, and a second signal to activate the second circuit when the second power that is less than the first power is delivered to the load.

In other features, power monitoring circuit is configured to assert a first signal to activate the first circuit and de-assert a second signal to de-activate the second circuit when the first power is delivered to the load, and to assert the second signal to activate the second circuit and de-assert the first signal to de-activate the first circuit when the second power that is less than the first power is delivered to the load.

In other features, the system further comprises an up-converter providing the input to the first inductor and an antenna connected to the second inductor as the load.

In other features, the system further comprises an up-converter providing the input to the first inductor and a power amplifier connected to the second inductor as the load.

In still other features, a method comprises coupling an input to a first inductance component of a balun and coupling the input to a load via a second inductance component of the balun. The method further comprises selecting, using a first circuit, an entire of the second inductance component in response to an amount of power delivered to the load being greater than a predetermined threshold. The method further comprises selecting, using a second circuit, a portion of the second inductance component in response to the amount of power delivered to the load being less than or equal to the predetermined threshold.

In other features, the method further comprises selecting, using the first circuit, an entire of the first inductance component in response to an amount of power delivered to the load being greater than a predetermined threshold. The method further comprises selecting, using the second circuit, a portion of the first inductance component in response to the amount of power delivered to the load being less than or equal to the predetermined threshold.

In other features, the method further comprises adjusting, using the first and second circuits, a ratio of the first inductance component to the second inductance component based on the amount of power delivered to the load.

In other features, the method further comprises maintaining a predetermined linearity regardless of the amount of power delivered to the load by adjusting, using the first and second circuits, a ratio of the first inductance component to the second inductance component based on the amount of power delivered to the load.

In other features, the method further comprises increasing, using the first and second circuits, a ratio of the first inductance component to the second inductance component in response to the amount of power delivered to the load being less than or equal to the predetermined threshold.

In other features, the method further comprises decreasing, using the first and second circuits, a ratio of the first inductance component to the second inductance component in response to the amount of power delivered to the load being greater than or equal to the predetermined threshold.

In other features, the method further comprises controlling, using the first and second circuits, a ratio of the first inductance component to the second inductance component to increase an input impedance at the first inductance component in response to the amount of power delivered to the load being less than or equal to the predetermined threshold.

In other features, the method further comprises controlling, using the first and second circuits, a ratio of the first inductance component to the second inductance component to decrease an input impedance at the first inductance component in response to the amount of power delivered to the load being greater than or equal to the predetermined threshold.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
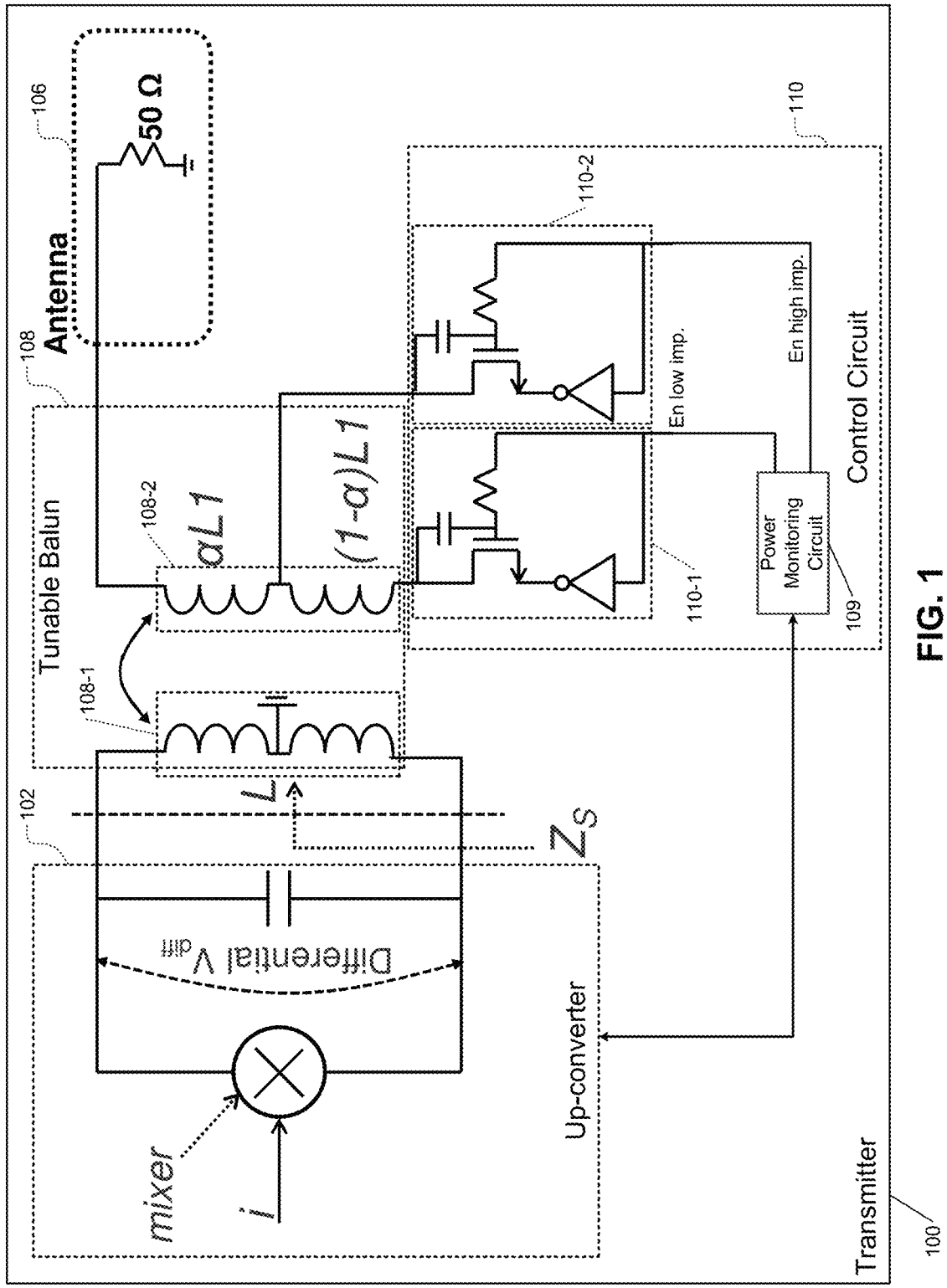
FIG. 1 is a schematic of a portion of a transmitter including a tunable balun.

FIG. 1 shows a tunable balun system according to the present disclosure. For example, a transmitter 100, suitably a wireless transmitter in an embodiment, comprises an up-converter 102, a tunable balun 108, a load (e.g., an antenna or a power amplifier) 106, and a control circuit 110 to control the tunable balun 108. For example, the up-converter 102 provides a differential output to be transmitted to the load 106. The tunable balun 108 converts the differential output of the up-converter 102 to a single-ended output and couples the single-ended output to the load 106. In accordance with an embodiment, the tunable balun system is configured to maintain the same or a predetermined linearity of the up-converter 102 (i.e., a fixed linear relationship between input power and gain of the up-converter 102) regardless of the amount of power delivered to the load 106.

Specifically, in brief, the control circuit 110 includes a power monitoring circuit 109 that monitors the output power being delivered by the up-converter 102 to the load 106. The control circuit 110 changes the primary to secondary inductance ratio of the tunable balun 108 depending on the output power delivered by the up-converter 102 to the load 106. Effectively, the control circuit 110 changes the input impedance seen at the input of the primary inductance of the tunable balun 108 depending on the output power delivered by the up-converter 102 to the load 106.

The tunable balun 108 includes primary and secondary inductances 108-1, 108-2 coupled together. The load 106 has an impedance $R_L$. An output power delivered by the up-converter 102 to the load 106 via the tunable balun 108 at resonance, assuming that the tunable balun 108 is lossless, is given by $P_{out}=i_{rms}^2 R_L$. A differential voltage swing at the input of the primary inductance of the tunable balun 108 is given by $V_{diff}=1.414\ i_{rms} R_L$ at resonance. While $P_{out}$ is proportional to $i_{rms}^2$, $V_{diff}$ is proportional to $i_{rms}$.

In non-tunable baluns, the primary to secondary ratio is typically 1:1. An input impedance seen at an input of the primary inductance of a non-tunable balun is given by $Z_s=R_L//Z_L$, where the symbol "//" denotes a parallel connection of the load 106 having the impedance $R_L$ and the impedance $Z_L$ of the secondary inductance L of the non-tunable balun. The higher the $V_{diff}$, the worse is the linearity of the up-converter 102. Accordingly, the linearity of the up-converter 102 when the output power is high is not the same as the linearity of the up-converter 102 when the output power is low.

As explained below in detail, using the tunable balun 108, at high output power, a low impedance is seen at the input of the primary inductance 108-1 of the tunable balun 108, which allows for a smaller voltage swing $V_{diff}$ at the input of the primary inductance 108-1 of the tunable balun 108 (the smaller voltage swing $V_{diff}$ being caused, for example, by a weak signal output by a DAC of a transmitter (not shown) to the up-converter 102 depending on the data to be transmitted), thereby improving linearity (i.e., the gain of the up-converter 102 does not have to be increased but rather the input impedance is decreased). When the output power decreases, switching to a high impedance helps in keeping the same linearity as at high output power (since the gain of the up-converter 102 does not have to be decreased but rather the input impedance is increased).

Figure 3:
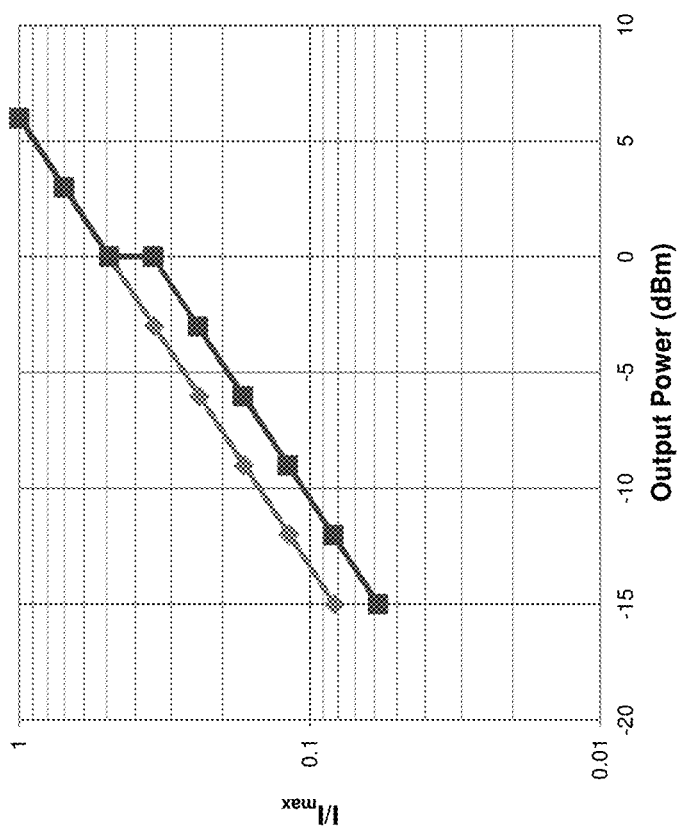
FIGS. 3 and 4 show a power level at which the tunable balun of FIG. 1 is switched between low and high impedance modes.
Figure 4:
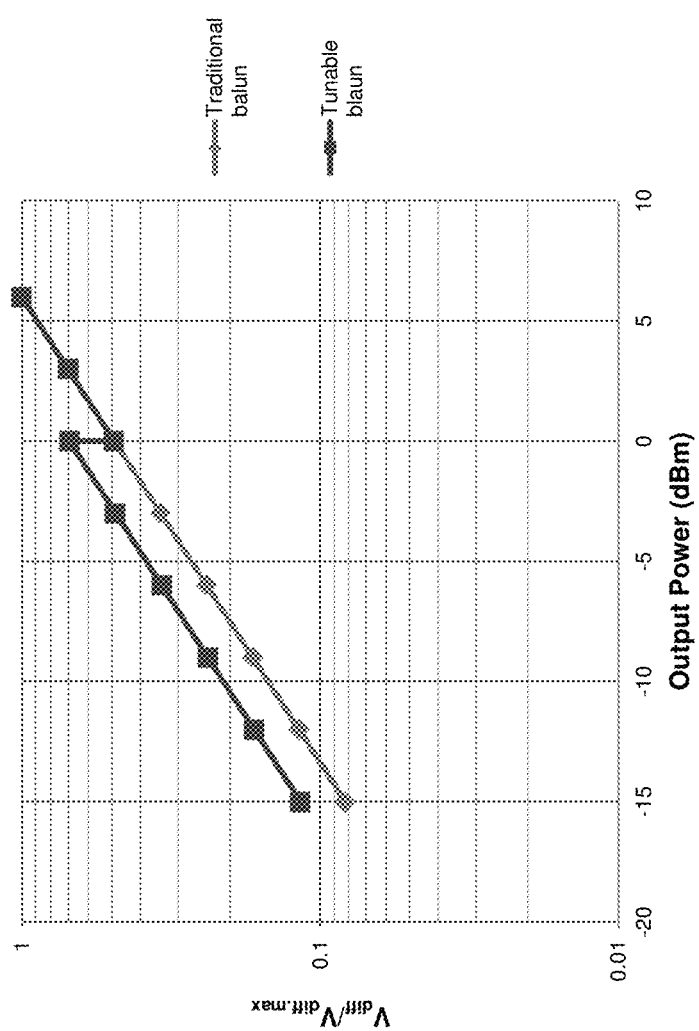

More specifically, the power monitoring circuit 109 monitors the power being delivered by the up-converter 102 to the load 106 (e.g., based on the current i and the load $R_L$ and using the formula $P_{out}=i_{rms}^2 R_L$). Suppose that the power monitoring circuit 109 determines that the output power delivered by the up-converter 102 to the load 106 is high (e.g., greater than a predetermined threshold). For example only, the predetermined threshold can be a fixed value such as 0 dBm as shown in FIGS. 3 and 4. When the output power delivered by the up-converter 102 to the load 106 is high, the power monitoring circuit 109 asserts an Enable low impedance signal and de-asserts an Enable high impedance signal.

The control circuit 110 includes a first circuit 110-1 and a second circuit 110-2 that configure the tunable balun 108 according to the amount of power delivered to the load 106 as follows. The control circuit 110 operates the tunable balun 108 in a low impedance mode in response to the power monitoring circuit 109 asserting the Enable low impedance input to the first circuit 110-1 and de-asserting the Enable high impedance input to the second circuit 110-2. In the low impedance mode, the first circuit 110-1 selects the entire secondary inductance $L_1$ 108-2 of the tunable balun 108 and couples the entire secondary inductance $L_1$ 108-2 of the tunable balun 108 to the primary inductance L 108-1 of the tunable balun 108. Specifically, the control circuit 110 activates the first circuit 110-1 in response to the power monitoring circuit 109 asserting the Enable low impedance signal. When activated, the first circuit 110-1 couples the entire secondary inductance $L_1$ 108-2 of the tunable balun 108 to the primary inductance L 108-1 of the tunable balun 108.

An input impedance seen at an input of the primary inductance L 108-1 of the tunable balun 108 is given by $Z_s=R_L//Z_L$, where the symbol "//" denotes a parallel connection of the load 106 having the impedance $R_L$ and the impedance $Z_L$ of the secondary inductance $L_1$ 108-2 of the tunable balun 108. The input impedance $Z_s$ seen at an input of the primary inductance L 108-1 of the balun 108 is reduced due to the first circuit 110-1 coupling the entire secondary inductance $L_1$ 108-2 of the tunable balun 108 to the primary inductance L 108-1 of the tunable balun 108.

Conversely, when the output power delivered by the up-converter 102 to the load 106 is low (e.g., less than or equal to the predetermined threshold, e.g. 0 dBm), the power monitoring circuit 109 de-asserts the Enable low impedance signal and asserts an Enable high impedance signal. The control circuit 110 operates the tunable balun 108 in a high impedance mode in response to the power monitoring circuit 109 de-asserting the Enable low impedance input to the first circuit 110-1 and asserting the Enable high impedance input to the second circuit 110-2.

In the high impedance mode, the second circuit 110-2 selects a portion $\alpha L_1$ (e.g., half of $L_1$ if $\alpha=\frac{1}{2}$) of the entire secondary inductance $L_1$ 108-2 of the tunable balun 108 and couples the portion $\alpha L_1$ (e.g., half of $L_1$ if $\alpha=\frac{1}{2}$) of the entire secondary inductance $L_1$ 108-2 of the tunable balun 108 to the primary inductance L 108-1 of the tunable balun 108. For example, the secondary inductance $L_1$ 108-2 of the tunable balun 108 can be a center-tapped inductance (i.e., if $\alpha=\frac{1}{2}$). Alternatively, a tapping point is provided in the secondary inductance $L_1$ 108-2 of the tunable balun 108 according to any selected value of $0<\alpha<1$.

In the high impedance mode, the control circuit 110 activates the second circuit 110-2 in response to the power monitoring circuit 109 asserting the Enable high impedance signal. When activated, the second circuit 110-2 couples the portion $\alpha L_1$ of the entire secondary inductance $L_1$ 108-2 of the tunable balun 108 to the primary inductance L 108-1 of the tunable balun 108. The input impedance $Z_s$ seen at an input of the primary inductance 108-1 of the balun 108 given by $Z_s=R_L//Z_L$ is increased due to the second circuit 110-2 coupling the portion $\alpha L_1$ of the entire secondary inductance $L_1$ 108-2 of the tunable balun 108 to the primary inductance L 108-1 of the tunable balun 108.

At high output power (i.e., when the output power is greater than the predetermined threshold, e.g., 0 dBm), the low impedance mode allows for a smaller voltage swing $V_{diff}$ at the input of the primary inductance of the tunable balun 108 (the smaller voltage swing $V_{diff}$ being caused, for example, by a weak signal output by a DAC of a transmitter (not shown) to the up-converter 102 depending on the data to be transmitted), which improves linearity. When the output power decreases (e.g., to less than or equal to a predetermined threshold, e.g., 0 dBm), switching to the high impedance mode saves current while keeping the same linearity as at high output power.

In other words, for the same current, since the impedance of the tunable balun 108 is increased by switching to the high impedance mode, the output power delivered to the load 106 is increased. Alternatively, for the same output power, since the impedance of the tunable balun 108 is increased by switching to the high impedance mode, the current consumption is decreased.

Further, the input impedance seen at the input of the primary inductance of the tunable balun 108 is given by $Z_s=R_L(L/\alpha L_1)//Z_L$, where the symbol "//" denotes a parallel connection of $R_L$ $(L/\alpha L_1)$ and L. For example, if $L=L_1$ and $\alpha=\frac{1}{2}$, (i.e., if $(L/\alpha L_1)=2$), in the high impedance mode (i.e., when the Enable high impedance input is asserted and the Enable low impedance input is de-asserted), the output power is 3 dB higher for the same current consumption, or the same output power is delivered by saving the current consumption by nearly 40%.

Figure 2:
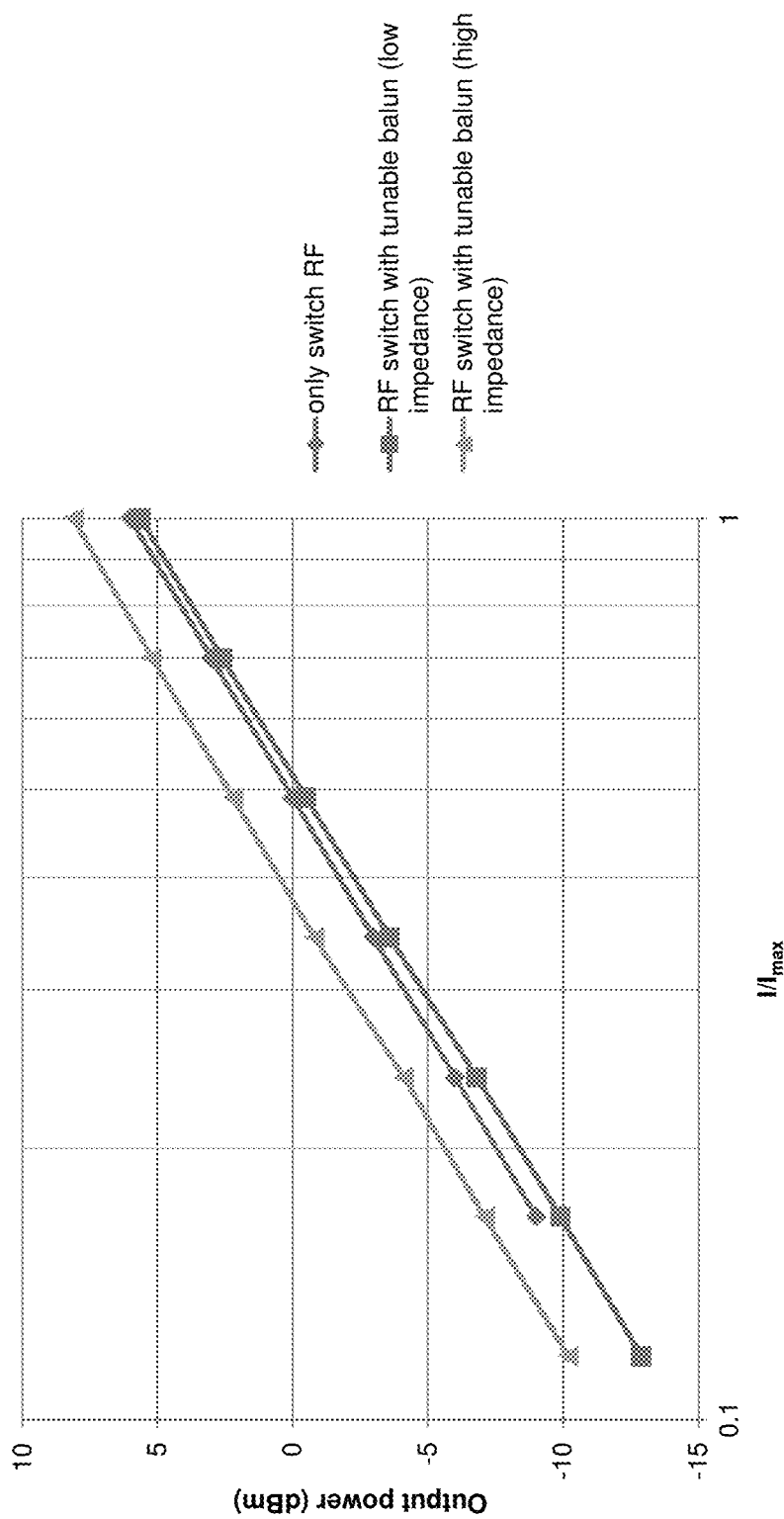
FIG. 2 is a graph showing a 3 dB increase in output power when an input impedance of the tunable balun of FIG. 1 is doubled.

FIG. 2 shows that doubling the input impedance of the tunable balun 108 by using the control circuit 110 and by selecting a suitable value of a increases the output power by 3 dB for the same current consumption. Stated differently, by doubling the input impedance of the tunable balun 108, the output power is kept the same while reducing current consumption by nearly 40%.

FIGS. 3 and 4 show that changing the ratio of primary to secondary inductance of the tunable balun 108 from low to high impedance at a predetermined power level (e.g., 0 dBm) using the control circuit 110 as explained above reduces current consumption at lower output power while keeping the same linearity as at higher output power.

Figure 5:
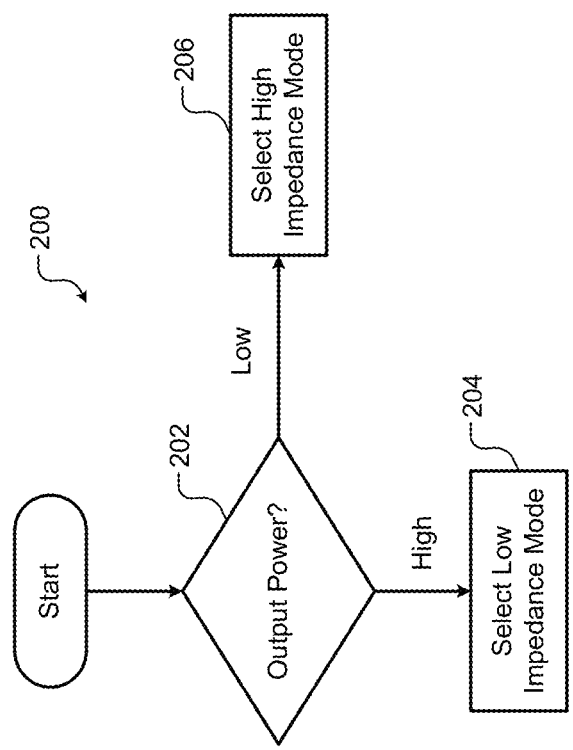
FIG. 5 is a flowchart of a method for using a tunable balun of FIG. 1 to maintain the same linearity regardless of the output power by switching the tunable balun between low and high impedance modes based on whether the output power is above or below a threshold.

FIG. 5 shows a method 200 according to the present disclosure for changing the input impedance of a tunable balun according to the output power delivered to a load while maintaining the same or predetermined linearity regardless of the amount of power delivered to the load. At 202, control determines whether the output power delivered to the load is high (i.e., greater than a predetermined threshold) or low (i.e., less than or equal to the predetermined threshold). For example only, the predetermined threshold can be 0 dBm as shown in FIGS. 5 and 6.

At 204, if the output power delivered to the load is high (i.e., greater than the predetermined threshold) or simply first power, control operates the tunable balun in a low impedance mode. Control selects and couples the entire secondary inductance of the tunable balun to the primary inductance of the tunable balun. At 206, if the output power delivered to the load is low (i.e., less than or equal to the predetermined threshold) or simply second power that is less than the first power, control operates the tunable balun in a high impedance mode. Control selects and couples a portion of the secondary inductance of the tunable balun to the primary inductance of the tunable balun. Accordingly, by changing the input impedance of the tunable balun according to the output power delivered to the load, the same or predetermined linearity is maintained regardless of the amount of power delivered to the load.

The teachings of the present disclosure are not limited to the manner of selecting the secondary inductance as described above. Alternatively or additionally, selecting the primary inductance in the same manner as the secondary inductance is also within the scope of the invention. That is, skilled artisans will appreciate from the present disclosure that, in addition to or instead of selecting the secondary inductance as described above, the control circuit 110 can be configured to similarly select the entire or a portion of the primary inductance in response to the amount of power delivered to the load.

For example, as explained above, the power monitoring circuit 109 monitors the output power delivered by the up-converter 102 to the load 106. When the output power delivered by the up-converter 102 to the load 106 is high, the power monitoring circuit 109 asserts the Enable low impedance signal and de-asserts the Enable high impedance signal. When the output power delivered by the up-converter 102 to the load 106 is low, the power monitoring circuit 109 de-asserts the Enable low impedance signal and asserts the Enable high impedance signal. The first and second circuits 110-1, 110-2 of the control circuit 110 change (i.e., increase or decrease) the primary to secondary inductance ratio of the tunable balun 108 depending on the output power delivered by the up-converter 102 to the load 106 by selecting the entire or a portion of the secondary inductance 108-2 as described above.

Similarly, the first and second circuits 110-1, 110-2 of the control circuit 110 change (i.e., increase or decrease) the primary to secondary inductance ratio of the tunable balun 108 depending on the output power delivered by the up-converter 102 to the load 106 by selecting the entire or a portion of the primary inductance 108-1 in addition to or instead of selecting the entire or a portion of the secondary inductance 108-2 as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:
1. A system comprising:
  a balun including a first inductor to receive an input and a second inductor to couple the input to a load;
  a power monitoring circuit configured to monitor an amount of power being delivered to the load when the input is coupled to the load;
  a first circuit configured to couple an entire of the second inductor to the first inductor when a first power is delivered to the load; and a second circuit configured to couple a portion of the second inductor to the first inductor when a second power that is less than the first power is delivered to the load.

2. The system of claim 1, wherein the power monitoring circuit is configured to generate a first signal to activate the first circuit when the first power is delivered to the load, and a second signal to activate the second circuit when the second power that is less than the first power is delivered to the load.

3. The system of claim 1, wherein the power monitoring circuit is configured to assert a first signal to activate the first circuit and de-assert a second signal to de-activate the second circuit when the first power is delivered to the load, and to assert the second signal to activate the second circuit and de-assert the first signal to de-activate the first circuit when the second power that is less than the first power is delivered to the load.

4. The system of claim 1 further comprising:
an up-converter providing the input to the first inductor; and
an antenna connected to the second inductor as the load.

5. The system of claim 1 further comprising:
an up-converter providing the input to the first inductor; and
a power amplifier connected to the second inductor as the load.

6. A method comprising:
coupling an input to a first inductance component of a balun;
coupling the input to a load via a second inductance component of the balun;
selecting, using a first circuit, an entire of the second inductance component in response to an amount of power delivered to the load being greater than a predetermined threshold; and
selecting, using a second circuit, a portion of the second inductance component in response to the amount of power delivered to the load being less than or equal to the predetermined threshold.

7. The method of claim 6, further comprising:
selecting, using the first circuit, an entire of the first inductance component in response to an amount of power delivered to the load being greater than a predetermined threshold; and
selecting, using the second circuit, a portion of the first inductance component in response to the amount of power delivered to the load being less than or equal to the predetermined threshold.

8. The method of claim 6, further comprising adjusting, using the first and second circuits, a ratio of the first inductance component to the second inductance component based on the amount of power delivered to the load.

9. The method of claim 6, further comprising maintaining a predetermined linearity regardless of the amount of power delivered to the load by adjusting, using the first and second circuits, a ratio of the first inductance component to the second inductance component based on the amount of power delivered to the load.

10. The method of claim 6, further comprising increasing, using the first and second circuits, a ratio of the first inductance component to the second inductance component in response to the amount of power delivered to the load being less than or equal to the predetermined threshold.

11. The method of claim 6, further comprising decreasing, using the first and second circuits, a ratio of the first inductance component to the second inductance component in response to the amount of power delivered to the load being greater than or equal to the predetermined threshold.

12. The method of claim 6, further comprising controlling, using the first and second circuits, a ratio of the first inductance component to the second inductance component to increase an input impedance at the first inductance component in response to the amount of power delivered to the load being less than or equal to the predetermined threshold.

13. The method of claim 6, further comprising controlling, using the first and second circuits, a ratio of the first inductance component to the second inductance component to decrease an input impedance at the first inductance component in response to the amount of power delivered to the load being greater than or equal to the predetermined threshold.

* * * * *